(12) United States Patent
Abdel-Hafeez et al.

(10) Patent No.: US 6,265,899 B1
(45) Date of Patent: *Jul. 24, 2001

(54) SINGLE RAIL DOMINO LOGIC FOR FOUR-PHASE CLOCKING SCHEME

(75) Inventors: Saleh Abdel-Hafeez, Santa Clara; Nalini Ranjan, San Jose, both of CA (US)

(73) Assignee: S3 Incorporated, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/326,161

(22) Filed: Jun. 4, 1999

(51) Int. Cl.⁷ .............................................. H03K 19/096
(52) U.S. Cl. ................................ 326/96; 326/95; 326/121
(58) Field of Search ................................ 326/93, 95, 96, 326/98, 99, 119, 121

(56) References Cited

U.S. PATENT DOCUMENTS

| | | | |
|---|---|---|---|
| 4,700,086 | 10/1987 | Ling et al. | 307/443 |
| 4,780,626 | 10/1988 | Guerin et al. | 607/448 |
| 4,896,057 | 1/1990 | Yang et al. | 307/448 |
| 5,015,882 | 5/1991 | Houston et al. | 907/453 |
| 5,041,742 | 8/1991 | Carbonaro | 307/452 |
| 5,121,003 | 6/1992 | Williams | 307/452 |
| 5,146,115 | 9/1992 | Benhamida | 307/452 |
| 5,208,489 | 5/1993 | Houston | 307/451 |
| 5,208,490 | 5/1993 | Yetter | 307/452 |
| 5,263,173 | * 11/1993 | Gleason | 395/800 |
| 5,343,090 | 8/1994 | Proebsting | 307/443 |
| 5,369,651 | 11/1994 | Mason | 307/230.06 |
| 5,402,012 | 3/1995 | Thomas | 326/97 |
| 5,453,708 | 9/1995 | Gupta et al. | 326/98 |
| 5,517,136 | 5/1996 | Harris et al. | 326/93 |
| 5,541,536 | 7/1996 | Rajivan | 326/98 |
| 5,550,490 | 8/1996 | Durham et al. | 326/98 |
| 5,642,061 | 6/1997 | Gorny | 326/97 |
| 5,661,675 | 8/1997 | Chin et al. | 364/768 |
| 5,708,374 | 1/1998 | Durham et al. | 326/93 |
| 5,712,578 | 1/1998 | Conley | 326/39 |
| 5,796,282 | 8/1998 | Sprague et al. | 327/210 |
| 5,825,208 | * 10/1998 | Levy et al. | 326/98 |
| 5,973,514 | * 10/1999 | Kuo et al. | 329/98 |
| 6,040,716 | * 3/2000 | Bosshart | 326/98 |

FOREIGN PATENT DOCUMENTS

WO 98/29949   7/1998  (WO) .

OTHER PUBLICATIONS

DAVID HARRIS, et al. "Skew–Tolerant Domino Circuits", IEEE Journal of Solid States Circuits, vol. 32, No. 11 (Nov. 1997).

* cited by examiner

Primary Examiner—David Nelms
Assistant Examiner—Gene N. Auduong
(74) Attorney, Agent, or Firm—Christie, Parker & Hale, LLP

(57) ABSTRACT

A single rail domino logic circuit using a four-phase clocking scheme. A stacked PMOS pair provides a quarter clock cycle precharge time. The quarter clock cycle precharge time allows for placement of an additional inverter in the output signal path to form both an output signal and a complement of the output signal for use in subsequent logic stages.

11 Claims, 3 Drawing Sheets

SINGLE RAIL DOMINO LOGIC FOR FOUR-PHASE CLOCKING SCHEME

BACKGROUND OF THE INVENTION

The present invention relates generally to digital electronic circuits, and more particularly relates to domino logic circuits.

Modern integrated circuits are required to perform ever increasing tasks, and at ever increasing operating speeds. The requirement to increase operating speeds has often been met by increasing the clock speed at which a circuit operates. For example, while integrated circuit operation once occurred at clock speeds on the order of 10 to 50 MHz, clock speeds now are often significantly greater than 100 MHz, and in some cases are even on the order of 400 MHz or more.

Increasing clock speeds, however, is not the only method available to circuit designers to increase the speed at which circuit operations occur. Circuit designers have also implemented circuitry which operates in a staged manner, with each stage evaluating over only a portion of a clock cycle and subsequent stages evaluating over subsequent portions of the clock cycle. That is, circuit designers arrange logic operations in a sequential manner, with each logic cell in the sequence providing information to subsequent logic cells in the sequence. These logic cells are evaluated during only a portion of the clock cycle, with subsequent logic cells evaluated in subsequent portions of the clock cycle. These logic cells therefore operate in a domino manner, and are often referred to as domino logic cells. The use of domino logic circuits allows designers to increase the effective speed of logic components without resorting to increasing clock speed.

In order to allow logic cells to evaluate their inputs in less than an entire clock cycle logic cells are often precharged. Precharging the logic cell is accomplished by driving the logic cell either to a mid range or to a high state. Driving the logic cell to a mid-range state allows the logic cell to change state with only a slight change in voltage. Thus the logic cell is able to change state at a faster rate than otherwise would occur. More often, however, the outputs of logic cells are driven to a high state. This is because PMOS transistors generally have a relatively large rise time due to parasitic capacitances. Accordingly, logic cell operation response time may be increased by charging the output to a high level prior to evaluation of the logic cell.

In a single clock cycle, therefore, a logic cell must be precharged, and thereafter allowed to evaluate its inputs. This is often accomplished by precharging the logic cell during one-half of a clock cycle, and allowing the logic cell to evaluate its inputs during the other half of the clock cycle. One constraint of such a methodology, however, is that the logic cell must evaluate and provide its outputs to a subsequent logic cell in one half of the clock cycle. Further, subsequent precharging of the logic cell during the first half of a subsequent clock cycle may modify the outputs of the logic cell. Accordingly, the logic cell should not begin precharging until after the subsequent logic cell has evaluated its inputs.

In order for domino logic circuits to meet such requirements, particularly when the circuits are also operating at high clock speeds, the derivation and use of additional signals based on the output of the logic cell should be kept to a minimum. One such additional signal is a complement of the output signal. Forming a complement of the output signal, using an inverter for example, poses several problems. The additional inverter used to form the output signal complement places a delay in a signal path of an input to the subsequent logic stage, thereby limiting the period in which the logic cell has to evaluate its inputs. Further, this delay effects only the complementary signal path (ignoring fan out related delays), and the output signal path does not include this delay. Accordingly, changes in the output signal during subsequent precharging are not delayed by the inverter in the signal path of the output complement signal. Thus, the period in which the subsequent logic cell may evaluate its input, starting from the time when the complementary output of the logic cell goes valid and ending at the time the effects of precharging propagate to the output signal of the logic cell, is reduced due to the use of the output signal complement.

Therefore, when use of an output signal complement is desired a dual rail, as opposed to signal rail, domino logic design is generally used. Single rail designs generally only have a single output per logic cell. Thus, a single rail design is monotonic in nature. In a dual rail design a first set of logic cells produces a set of signals, and a second set, or rail, of logic cells produces the complements of these signals. Dual rail designs, however, require significantly greater number of gates than a single rail design, resulting in increased chip layout space as well as increased power consumption.

The requirement for increased functionality of integrated circuits, thus, results in a need to decrease the area occupied by logic while also increasing the size of the integrated circuit as a whole. To the extent the need for increased functionality outstrips the ability to decrease gate size and increase chip die size, chip area is placed at a premium. The use of dual rail designs, therefore, impacts the ability of designers to provide increased functionality in integrated circuits.

SUMMARY OF THE INVENTION

Thus, the present invention provides a domino logic circuit providing both an output signal and a complement of the output signal. The present invention includes a logic circuit with a precharger. A logic circuit with a precharger includes a logic cell and a precharged circuit including multiple transistors. In another embodiment, the invention comprises a single rail domino logic circuit. The single rail domino logic circuit includes a plurality of logic cells providing information. The logic cells are arranged in a sequence from a first logic cell to a last logic cell, with each of the logic cells subsequent in the sequence providing information from a prior logic cell. Each of the logic cells has an associated precharged circuit, and each of the precharged circuits comprises a pair of transistors.

Many of the attendant features of this invention will be more readily appreciated as the same becomes better understood by reference to the following detailed description considered in connection with the accompanying drawings in which like reference symbols designate like parts throughout.

DETAILED DESCRIPTION

Figure 1:
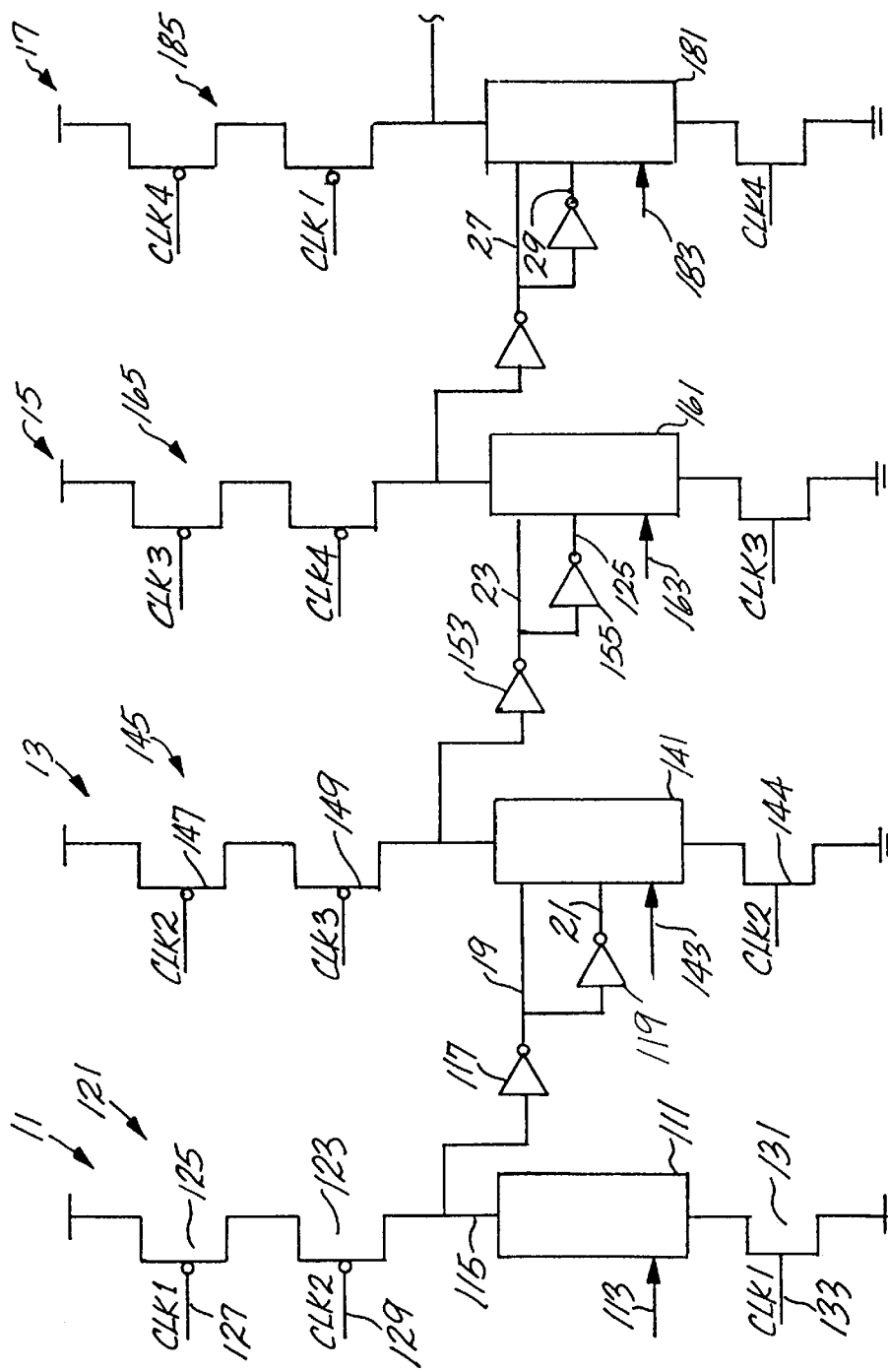
FIG. 1 is a semi-schematic semi-block diagram of a domino logic circuit of the present invention.

FIG. 1 illustrates a single rail domino logic circuit of the present invention. The domino logic circuit has a first stage 11, a second stage 13, a third stage 15, and a fourth stage 17. The first stage provides a first stage output signal 19, and its complement 21, to the second stage. Similarly, the second stage provides the third stage a second stage output signal 23, and its complement 25, to the third stage, and the third stage provides a third stage output signal 27, and its complement 29, to the fourth stage. Thus, the four stages are arranged in a domino fashion, with subsequent stages following preceding stages. Further, each stage provides a differential, i.e., complementary, output signal to a subsequent stage.

The domino logic circuit is provided four clock signals forming a four phase clocking scheme. This is accomplished by having each of the four clock signals be of the same frequency, but phase shifted with respect to the other clock signals in ninety degree increments. The clock signals, therefore, are symmetrically phase-shifted. Each stage receives two of these clock signals.

The first stage includes NMOS first stage logic circuitry 111 which acts on logic inputs 113. Coupled to the first stage logic circuitry is precharge circuitry 121. The precharge circuitry is a stacked PMOS pair, with a source of a first PMOS transistor 125 connected to a power supply and a source of a second PMOS transistor 123 connected to the drain on the first PMOS transistor. The drain of the second PMOS transistor is, in turn, connected to the logic circuitry.

Figure 2:
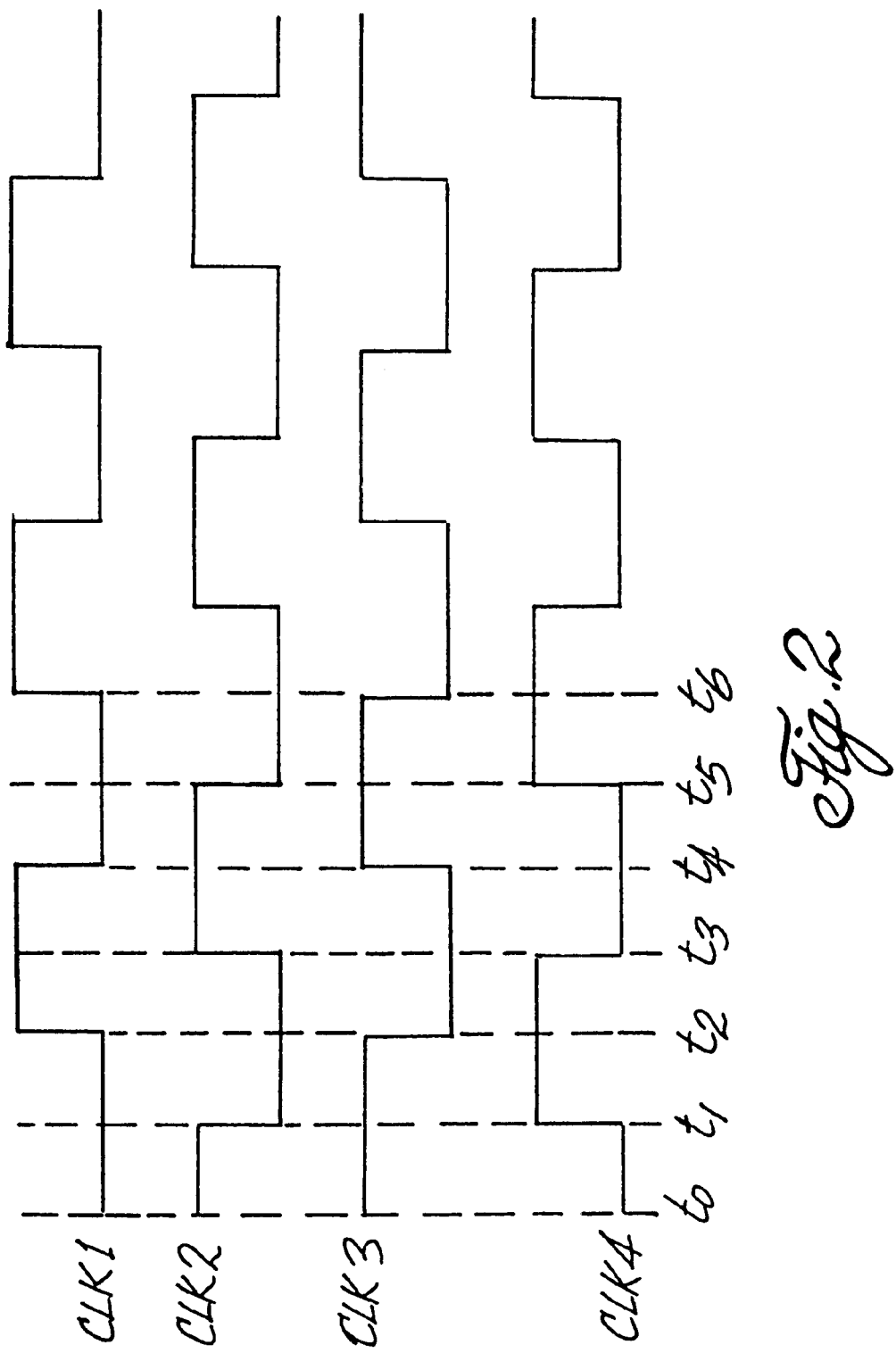
FIG. 2 is a timing diagram of clock signals generated by a four-phase clock used in the present invention.

A gate of the first PMOS transistor of the precharge circuitry is provided a first clock signal (CLK1). A gate of the second PMOS transistor is provided a second clock signal (CLK2). The first and second clock signals are of the same frequency, but the second clock signal is phase shifted by 90° with respect to the first clock signal. Thus, the second clock signal has a rising edge delayed by a quarter clock cycle compared to the first clock signal. Likewise, a falling edge of the second clock signal is delayed by a quarter clock cycle compared to a falling edge of the first clock signal. This is illustrated graphically in FIG. 2. As is illustrated in FIG. 2, at time $t_2$ the first clock signal has a rising edge, while the second clock signal remains low. A quarter clock cycle later, at time $t_3$, the second clock signal has a rising edge. Similarly, a quarter clock cycle after time $t_3$, namely at time $t_4$, the first clock signal has a falling edge while the second clock signal remains high. At time $t_5$, which is a quarter clock cycle after time $t_4$, the second clock signal has a falling edge.

As the first and second clock signals are provided to the gate of the first PMOS transistor and the gate of the second PMOS transistor, respectively, the first and second PMOS transistors are both on only when both the first clock signal and the second clock signal are low. As the first clock signal and the second clock signal are both low only for a quarter of each clock period, the precharge circuitry only precharges the NMOS logic for a quarter clock cycle. In addition, the drain of the second PMOS transistor is connected to an inverter 117. The inverter 117 provides the first stage output. One of the primary purposes of the inverter 117 is to drive the first stage output signal to the succeeding stage. In addition, the first stage output is provided to a second inverter 119. The second inverter provides the complement of the first stage output signal and similarly serves to drive the complement of the first stage output signal to the succeeding stage.

The logic circuitry 111 is also connected to a drain of an NMOS driving transistor 131. The gate of the driving transistor 131 is provided the first clock signal. Thus, when the first clock signal goes high the driving transistor becomes active and the logic circuitry evaluates its inputs. As the precharge circuitry becomes inactive when the first clock signal goes high, the output of the first stage is dependent on the inputs of the logic circuitry. Accordingly, for every complete clock cycle the first stage will precharge during a quarter of the clock cycle, and hold its output for three-quarters of the clock cycle at which time precharging once again occurs.

The second stage is similar to the first stage. The second stage includes second stage logic circuitry 141. The second stage logic circuity receives logic inputs 143, as well as the complementary outputs from the first stage. The second stage also has precharge circuitry 145 comprising a stacked PMOS pair of transistors 147 and 149. The stacked PMOS pair of the second stage receives as inputs to their gates the second clock signal and a third clock signal (CLK3). The third clock signal is delayed by a quarter clock cycle with respect to the second clock signal, and is therefore 90° out of phase from the second clock signal and 180° out of phase from the first clock signal. Thus, whereas the first stage precharges between times $t_1$ and $t_2$, the second stage precharges between times $t_2$ and $t_3$. Accordingly, the second stage operates with a quarter clock cycle delay as compared to the first stage.

The drain of the second PMOS transistor 149 is connected to an inverter 153. The inverter 153 acts as a driving invertor, and produces the second stage output. The second stage output is also provided to an invertor 155 which provides the complement of the second stage output. The second stage output and the complement of the second stage output are provided to the third stage.

The second stage logic circuitry 111 is also connected to a drain of an NMOS driving transistor 144. The gate of the driving transistor 144 is provided the second clock signal. Thus, when the first clock signal goes high the driving transistor becomes active and the logic circuitry evaluates its inputs. As the precharge circuitry becomes inactive when the second clock signal goes high, the output of the first stage is dependent on the inputs of the logic circuitry. Accordingly, for every complete clock cycle the first stage will precharge during a quarter of the clock cycle and hold its output for three- quarters of the clock cycle at which time precharging once again occurs.

The third stage is similar to the first and second stages. As with the first and second stages, the third stage includes logic circuitry 161 having as inputs the second stage output and the complement of the second stage output, as well as logic inputs 163. Coupled to the logic circuitry is precharge circuitry 165. As with the first and second stages, the precharge circuitry includes a stacked PMOS pair. The gates of the stacked PMOS pair are provided the third clock signal and a fourth clock signal (CLK4). The fourth clock signal is 90° out of phase from the third clock signal, and 270° out of phase from the first clock signal. Thus, the third stage logic circuitry is precharged beginning at time $t_3$ until time $t_4$.

The fourth stage is similar to the first, second, and third stages. As with the prior stages, the fourth stage includes logic circuitry 181 having as inputs the third stage output and the complement of the third stage output, as well as logic inputs 183. Coupled to the logic circuitry is precharge circuitry 185. As with the prior stages, the precharge circuitry includes a stacked PMOS pair. The gates of the stacked PMOS pair are provided a fourth clock signal and the first clock signal. Thus, the fourth stage logic circuitry is precharged beginning at a time $t_4$ until time $t_5$, and evaluates beginning at time $t_5$.

Figure 3:
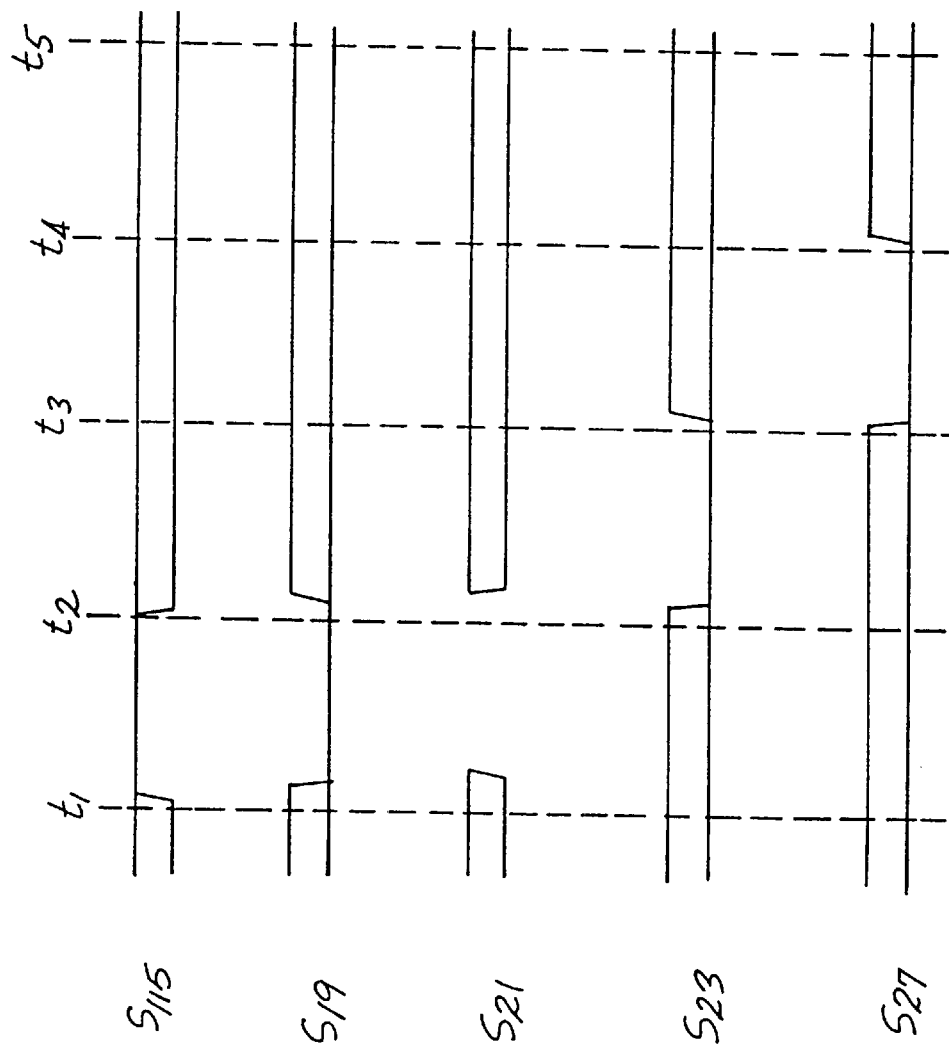
FIG. 3 is a timing diagram of operation of the domino logic circuit of the present invention.

FIG. 3 illustrates the timing diagram of the operation of the domino logic circuit of FIG. 1 when supplied the clock signals of FIG. 2. At time $t_1$ the second clock signal goes low, and the first clock signal is already low. Slightly after time $t_1$, therefore, a signal $S_{115}$ at the drain of the second PMOS transistor 123 goes high. Using 0.25 micron technology, the change in the signal $S_{115}$ occurs approximately 0.2 nanoseconds after the second clock signal goes low. Thus, shortly after the second clock signal goes low at time $t_1$ the first domino logic stage begins precharging.

When the first domino logic stage begins precharging the input to inverter 117 also goes high. The output of the first stage, $S_{19}$, therefore goes low one inverter delay after the drain of the second PMOS transistor goes high. Similarly, the output of the second inverter 119, producing the complement of the first stage output, goes high one inverter delay after the output to the first inverter goes low.

The output of the first stage $S_{19}$ stays low until the first clock signal goes high at time $t_2$. Once the first clock signal goes high at time $t_2$ the first domino logic stage evaluates and the output signal $S_{19}$ may change depending on the results of that evaluation.

The second domino logic stage begins precharging also at time $t_2$ as the second clock signal is low and the third clock signal goes low. The second domino logic stage continues precharging until time $t_3$ when the second clock signal goes high and the second domino logic stage evaluates. Accordingly, the first domino logic stage should have a completed evaluation and propagated its output signals to the second domino logic stage.

The third domino logic stage begins precharging At time $t_3$ as the fourth clock signals goes low and the third clock signal is already low. Thus, shortly after time $t_3$ the output from the inverter, signal $S_{27}$, goes low.

The third clock signal goes high at time $t_4$ and the third domino logic stage begins evaluation. Accordingly, by time $t_4$ the second domino logic stage should have evaluated its inputs and propagated its outputs to the third domino stage. Also at time $t_4$ the fourth domino logic stage begins precharging as the first clock signal goes low and a fourth clock signal is already low.

At time $t_5$ the second clock signal goes low and the first signal is already low. Accordingly, the first domino logic stage once again begins precharging. Shortly after time $t_5$ therefore the first stage output goes low. As the first stage output going low may affect the second stage output, the third stage should have completed evaluation prior to the time at which the first stage begins precharging, taking into account signal propagation delays.

Thus, each stage of the four stage single rail domino logic circuit precharges for one-quarter of a clock cycle, and evaluates and holds its output for each remaining three-quarters of a clock cycle. This is illustrated in Table I.

TABLE 1

| | CLOCK CYCLE | | | |
|---|---|---|---|---|
| | ¼ | 2/4 | ¾ | 4/4 |
| Stage 1 | P | E | H | H |
| Stage 2 | H | P | E | H |
| Stage 3 | H | H | P | E |
| Stage 4 | E | H | H | P |

As shown in Table I, the first stage precharges during a first quarter clock period, and evaluates during a second quarter clock period. The first stage holds its outputs during a third quarter clock period, during which time a second stage evaluates, and further holds its outputs during a fourth quarter clock cycle while the third stage evaluates. Holding the outputs for two quarter clock periods aids in preventing a race condition.

More fully, a total time period T with respect to any stage may be described as $T=t_p+t_e$, where $t_p$ is the time allotted for precharging and $t_e$ is the time allotted for evaluation of inputs and holding outputs stable so that subsequent stages may evaluate. In the absence of time borrowing, $t_p$ should be greater than or equal to the actual precharge time $t_{precharge}$, plus any time required to account for clock skew. Similarly $t_e$ should be greater than or equal to the actual evaluation time plus the hold time plus any time required to account for signal skew. With respect to the described embodiment, $t_p$ is a quarter clock cycle, evaluation of inputs is a greater clock cycle, and hold time is budgeted as two quarter clock cycles (although it should be noted that the logic for a stage is isolated from both $V_{DD}$ and $V_{SS}$ for only a quarter clock cycle). Thus, $T=t_{precharge}+¼T+t_{hold}+2t_{skew}$, or $T=t_{precharge}+\frac{3}{2}t_{skew}$.

The present invention therefore provides a single rail domino logic circuit for a four-phase clocking scheme. The signal rail domino logic circuit of the present invention is able to provide complementary output signals without the need of a dual rail design. For example, a 64 bit adder using the single rail domino logic circuit of the present invention, under 0.25 micron technology and provided a 250 MHZ clock frequency, results in reduced gate count of approximately thirty percent. Accordingly, the present invention provides reduced gate count with respect to a dual rail design.

Although this invention has been described in certain specific embodiments, many additional modifications and variations would be apparent to those skilled in the art. It is, therefore, to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A single rail domino logic circuit comprising:
   a plurality of logic cells in a sequence, the logic cells providing an output and a complement of the output to succeeding logic cells in the sequence,
   a plurality of precharge circuits, a precharge circuit coupled to each logic cell, each precharge circuit including a first transistor and a second transistor, with the first transistor and the second transistor receiving clock signals out of phase with each other.

2. The single rail domino circuit of claim 1 wherein the precharge circuits comprise a first transistor and a second transistor, the first and second transistors having sources, drains and gates, with the drain of the first transistor coupled to the source of the second transistor, and the drain of the second transistor coupled to the logic cell.

3. The single rail domino logic circuit of claim 2 wherein the gate of the first transistor is coupled to a first clock signal and the gate of the second transistor is coupled to a second clock signal.

4. The logic circuit with a precharger of claim 3 wherein the first transistor and the second transistor are both PMOS transistors.

5. The logic circuit with a precharger of claim 4 wherein the first clock signal and the second clock signal are out of phase by approximately ninety degrees.

6. The single rail domino logic circuit of claim 5 wherein the output of each logic cell is provided by a signal driver, and the complementary of each logic cell is provided by a first inverter coupled to the signal driver.

7. The single rail domino logic circuit of claim 6 wherein the signal driver is a second inverter, and an input of the first inverter is coupled to an output of the second inverter.

8. A single rail domino logic circuit comprising:
   a plurality of logic cells providing information, the logic cells being arranged in a sequence from a first logic cell to a last logic cell, each of the logic cells subsequent in the sequence from the first logic cell being provided an information signal and a complement information signal from a prior logic cell in the sequence; and
   a plurality of precharge circuits, each of the precharge circuits being coupled to a corresponding one of the plurality of logic cells, and each one of the precharge circuits comprising a pair of transistors, the pair of transistors receiving two clock signals, the two clock signals being out of phase with each other.

9. A single rail domino logic circuit comprising:
   a plurality of logic cells, each of the logic cells producing a corresponding output signal;
   a plurality of driving inverters, each of the driving inverters being coupled to a corresponding logic cell so as to receive the corresponding output signal and to propagate the inverse of the corresponding output signal to a subsequent logic cell;
   a plurality of complementary inverters, each of the complementary inverters being coupled to a corresponding driving inverter so as to receive the inverse of the corresponding output signal and to propagate a complement of the inverse of the corresponding output signal to a subsequent logic cell;
   a plurality of first PMOS precharge transistors, each of the plurality of first PMOS precharge transistors being coupled to a corresponding one of the plurality of logic cells by their sources; and
   a plurality of second PMOS precharge transistors, each of the plurality of second PMOS precharge transistors being coupled to a corresponding one of the plurality of first PMOS precharge transistors.

10. A method of producing data using a single rail domino logic circuit using a four-phase clock comprising:
    precharging a first logic cell in a first quarter clock cycle;
    evaluating inputs to the first logic cell to produce a first logic cell output and a first logic cell complementary output and precharging a second logic cell in a second quarter clock cycle; and
    holding the first logic cell output and the first logic cell complementary output.

11. The method of claim 10 wherein precharging the first logic cell in a first quarter clock cycle comprises providing the first logic cell a first clock signal and a second clock signal, with the second clock signal approximately ninety degrees out of phase with the first clock signal.

* * * * *

UNITED STATES PATENT AND TRADEMARK OFFICE
CERTIFICATE OF CORRECTION

PATENT NO. : 6,265,899 B1
DATED : July 24, 2001
INVENTOR(S) : Saleh Abdel-Hafeez and Nalini Ranjan It is certified that error appears in the above-identified patent and that said Letters Patent is hereby corrected as shown below:

Title page,
Item [56], References Cited, U.S. PATENT DOCUMENTS,
Replace "5,369,651   11/1994   Mason .... 307/230.06"
with -- 5,369,621   11/1994   Mason .... 307/230.06 --

Column 4,
Line 48, replace "three- quarters" with -- three-quarters --.

Column 6,
Line 36, replace "¾ 2$t_{skew}$" with -- ¾T+2$t_{skew}$ --.

Signed and Sealed this

Fourth Day of February, 2003

JAMES E. ROGAN
*Director of the United States Patent and Trademark Office*